(12) United States Patent
Bang et al.

(10) Patent No.: US 10,672,451 B2
(45) Date of Patent: Jun. 2, 2020

(54) STORAGE DEVICE AND REFRESH METHOD THEREOF

(71) Applicant: Samsung Electronics Co., Ltd., Suwon-si (KR)

(72) Inventors: Kyoung Il Bang, Suwon-si (KR); Jun-Ho Jang, Hwaseong-si (KR); Dong Gi Lee, Yongin-si (KR)

(73) Assignee: SAMSUNG ELECTRONICS CO., LTD., Samsung-ro, Yeongyong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/947,442

(22) Filed: Apr. 6, 2018

(65) Prior Publication Data

US 2019/0074053 A1  Mar. 7, 2019

(30) Foreign Application Priority Data

Sep. 7, 2017  (KR) .................. 10-2017-0114768

(51) Int. Cl.
| | |
|---|---|
| G11C 7/00 | (2006.01) |
| G11C 11/406 | (2006.01) |
| G11C 16/30 | (2006.01) |
| G06F 12/02 | (2006.01) |
| G11C 7/22 | (2006.01) |
| G11C 16/34 | (2006.01) |

(52) U.S. Cl.
CPC .... *G11C 11/40626* (2013.01); *G06F 12/0246* (2013.01); *G11C 7/22* (2013.01); *G11C 7/222* (2013.01); *G11C 11/40615* (2013.01); *G11C 16/30* (2013.01); *G11C 16/349* (2013.01)

(58) Field of Classification Search
CPC ..... G11C 11/40626; G11C 7/22; G11C 7/222; G11C 11/40615; G11C 16/30; G11C 16/349; G06F 12/0246
USPC ........................ 365/222, 228, 226
See application file for complete search history.

(56) References Cited

U.S. PATENT DOCUMENTS

| | | | |
|---|---|---|---|
| 5,414,861 A | 5/1995 | Homing | |
| 6,128,746 A * | 10/2000 | Clark | G06F 1/3203 713/324 |
| 6,134,167 A * | 10/2000 | Atkinson | G11C 11/406 365/222 |

(Continued)

FOREIGN PATENT DOCUMENTS

| | | |
|---|---|---|
| JP | 2009-251627 A | 10/2009 |
| JP | 2012-242925 A | 12/2012 |

(Continued)

*Primary Examiner* — Viet Q Nguyen
(74) *Attorney, Agent, or Firm* — Muir Patent Law, PLLC

(57) ABSTRACT

A storage device and a refresh method thereof are provided. The storage device includes at least a first processing core configured to operate by receiving a first power from a host, a second processing core separate from the first processing core, at least a first three-dimensional (3D) flash memory, a power module and a retention management module supplied with a second power from the power module when the first power is not supplied from the host. The retention management module is configured to refresh a part of the first 3D flash memory using the second processing core. The retention management module is configured to be woken up at intervals of a first period to refresh the part of the first 3D flash memory.

20 Claims, 10 Drawing Sheets

(56) References Cited

U.S. PATENT DOCUMENTS

| | | |
|---|---|---|
| 6,181,630 B1 | 1/2001 | Caulkins |
| 6,496,939 B2 | 12/2002 | Portman et al. |
| 7,266,034 B2 | 9/2007 | Hirai et al. |
| 7,487,391 B2 | 2/2009 | Pecone et al. |
| 7,830,732 B2 | 11/2010 | Moshayedi et al. |
| 7,840,825 B2 | 11/2010 | Altevogt et al. |
| 8,074,112 B1 | 12/2011 | Chang et al. |
| 8,093,868 B2 | 1/2012 | Cagno et al. |
| 8,169,825 B1 | 5/2012 | Shalvi et al. |
| 8,261,136 B2 | 9/2012 | Abreu et al. |
| 8,370,720 B2 | 2/2013 | Allen |
| 8,432,768 B2 * | 4/2013 | Ware .................... G11C 7/04 365/233.1 |
| 8,694,812 B2 | 4/2014 | Vedder et al. |
| 8,824,222 B2 * | 9/2014 | Ware .................... G06F 1/3275 365/191 |
| 8,843,700 B1 | 9/2014 | Salessi et al. |
| 8,908,443 B1 | 12/2014 | Ellis |
| 9,042,197 B2 | 5/2015 | Allison et al. |
| 9,110,596 B2 * | 8/2015 | Ware .................... G06F 1/3275 |
| 9,110,649 B2 | 8/2015 | Matsuda |
| 9,269,451 B2 | 2/2016 | Ellis |
| 9,280,419 B2 | 3/2016 | Chunn et al. |
| 9,299,415 B1 * | 3/2016 | Asbury ................ G11C 11/4063 |
| 9,342,259 B2 | 5/2016 | Bartling et al. |
| 9,361,030 B2 | 6/2016 | Tuers et al. |
| 9,543,025 B2 | 1/2017 | Fitzpatrick et al. |
| 9,571,128 B2 | 2/2017 | Chunn et al. |
| 9,778,851 B2 | 10/2017 | Park et al. |
| 9,984,757 B2 * | 5/2018 | Lee ........................ G11C 16/26 |
| 10,242,719 B2 * | 3/2019 | Doo ........................ G06F 1/266 |
| 2005/0064829 A1 * | 3/2005 | Kang .................. H04W 52/028 455/127.1 |
| 2008/0162980 A1 * | 7/2008 | Dahan ................ G06F 13/1694 713/601 |
| 2011/0055671 A1 * | 3/2011 | Kim .................... G06F 11/1028 714/800 |
| 2012/0210076 A1 | 8/2012 | Jang et al. |
| 2013/0027413 A1 * | 1/2013 | Jayavant ................ G06F 1/325 345/520 |
| 2013/0124895 A1 * | 5/2013 | Saha ........................ G06F 1/26 713/323 |
| 2013/0205075 A1 | 8/2013 | Twitto et al. |
| 2014/0006859 A1 | 1/2014 | Ryu |
| 2015/0058550 A1 | 2/2015 | Mikami |
| 2015/0362987 A1 * | 12/2015 | Shin .................... G06F 1/3296 713/322 |
| 2016/0155491 A1 * | 6/2016 | Roberts ............. G11C 11/40607 711/106 |
| 2016/0231797 A1 * | 8/2016 | Meir .................... G06F 3/0655 |
| 2017/0010838 A1 | 1/2017 | Hong et al. |
| 2017/0062073 A1 * | 3/2017 | Backsen ................ G11C 29/02 |
| 2017/0147209 A1 | 5/2017 | Lee et al. |
| 2017/0168891 A1 | 6/2017 | Park |

FOREIGN PATENT DOCUMENTS

| | | |
|---|---|---|
| JP | 2014-178974 A | 9/2014 |
| JP | 2015-203995 A | 11/2015 |

* cited by examiner

FIG. 6

| Area id | 1 | 2 | ... |
|---|---|---|---|
| Start physical address | 0x1000 | 0x4000 | ... |
| End physical address | 0x2000 | 0x6000 | ... |
| Area size | 0x1000 | 0x2000 | ... |
| Minimum refresh period | 10 Days | 300 Days | ... |
| Timer check period | 5 Days | 300 Days | ... |
| Refresh priority (1-10) | high (1) | low (10) | ... |
| Refresh policy | Dynamic (check & refresh at every wake-up, dynamic priority) | Static (refresh with fixed priority, round-robin) | ... |
| Health status (cf. avg. BER) | 40% ($10^{-4}$) | 90% ($10^{-1}$) | ... |
| Erase count (representative value) | 3K | 1K | ... |
| Program time (representative value) | 2017.01.01. 10:11 | 2017.05.10. 14:25 | ... |
| Program temperature | -2.5 ℃ | +25.3 ℃ | ... |
| Temperature average rate of change (wake-up period) | $10^{-1}$ ℃/day | $10^{-5}$ ℃/day | ... |

… (1)

STORAGE DEVICE AND REFRESH METHOD THEREOF

This application claims priority to Korean Patent Application No. 10-2017-0114768, filed on Sep. 7, 2017, and all the benefits accruing therefrom under 35 U.S.C. § 119, the disclosure of which is incorporated herein by reference in its entirety.

BACKGROUND

1. Field

The present disclosure relates to a storage device and a refresh method thereof.

2. Description of the Related Art

A flash memory device may include a memory cell array, the memory cell array may include a plurality of blocks, each of the blocks may include pages, and each of the pages may include nonvolatile memory cells.

The flash memory device may be classified into a negative-AND (NAND) flash memory device or a negative-OR (NOR) flash memory device. Each of the nonvolatile memory cells includes a floating gate.

A long period of time after storing information in a flash memory cell, charges stored in the floating gate of the flash memory cell (i.e., charges associated with the stored information) may be lost. As a result, scattering characteristics may deteriorate. When retention is performed when the flash memory cell is not supplied with power for a long period of time, the threshold voltage of the flash memory cell may be changed.

Then, when the threshold voltage of the flash memory cell becomes lower than a read voltage, the value of a bit read from the flash memory cell during a read operation is changed. Accordingly, information read from the flash memory cell may become an error bit.

If the threshold voltages of at least some flash memory cells included in a page are changed, page data corresponding to the page may include many error bits.

Thereafter, if a read operation is performed on the at least some flash memory cells, the performance of the read operation may considerably deteriorate, depending on the number of error bits, and due to the excessive execution of defensive code, and the deterioration of the performance of the read operation may be continued for a long period of time.

Thus, research is being conducted on memory cells capable of being self-refreshed without being supplied with power.

SUMMARY

Exemplary embodiments of the present disclosure provide a storage device with an improved refresh performance.

Exemplary embodiments of the present disclosure also provide a refresh method of a storage device with an improved refresh performance.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, there is provided a storage device comprising at least a first processing core configured to operate by receiving power from a first power from a host, a second processing core, which is separate from the first processing core, at least a first three-dimensional (3D) flash memory, a power module and a retention management module. The retention management module is supplied with a second power by the power module when the first power is not supplied from the host, the retention management module is configured to refresh a part of the at least a first 3D flash memory with the second processing core, and the retention management module is woken up at intervals of a first period to refresh the part of the at least a first 3D flash memory.

According to the aforementioned and other exemplary embodiments of the present disclosure, a storage device comprising at least one processing core, a volatile memory, a plurality of first memory channels each connected to a respective nonvolatile memory, a bus connecting the at least one processing core, the volatile memory, and the first memory channels and a retention management module configured to refresh at least part of a first nonvolatile memory using the at least one processing core and the volatile memory. The retention management module is configured to be periodically woken up when there is no power supplied from a host, sets the part of the first nonvolatile memory as a target refresh area, selects a minimum resource combination of the storage device for refreshing the target refresh area, sets a voltage and a clock frequency corresponding to the minimum resource combination to be lower than when the power is supplied from the host, and refreshes the target refresh area. The minimum resource combination includes at least a part of the at least one processing core and includes the volatile memory.

According to the aforementioned and other exemplary embodiments of the present disclosure, there is provided a refresh method of a storage device including at least one nonvolatile memory, comprising waking up a retention management module by receiving a second power from a power module when a first power is not supplied from a host, selecting a target refresh area of the at least one nonvolatile memory, determining a minimum resource combination of the storage device for refreshing the target refresh area, selecting a power domain and a voltage of the second power to be supplied for the minimum resource combination, selecting a clock domain and a clock frequency to be applied for the minimum resource combination, performing a refresh operation of the target refresh area using the minimum resource combination and setting a next wake-up time.

Other features and exemplary embodiments may be apparent from the following detailed description, the drawings, and the claims.

BRIEF DESCRIPTION OF THE DRAWINGS

The above and other exemplary embodiments and features of the present disclosure will become more apparent by describing in detail exemplary embodiments thereof with reference to the attached drawings, in which:

FIG. 6 is a table showing a refresh area list used in the method of FIG. 5;

DETAILED DESCRIPTION

Some exemplary embodiments of the present disclosure will hereinafter be described in detail with reference to the accompanying drawings.

Figure 1:
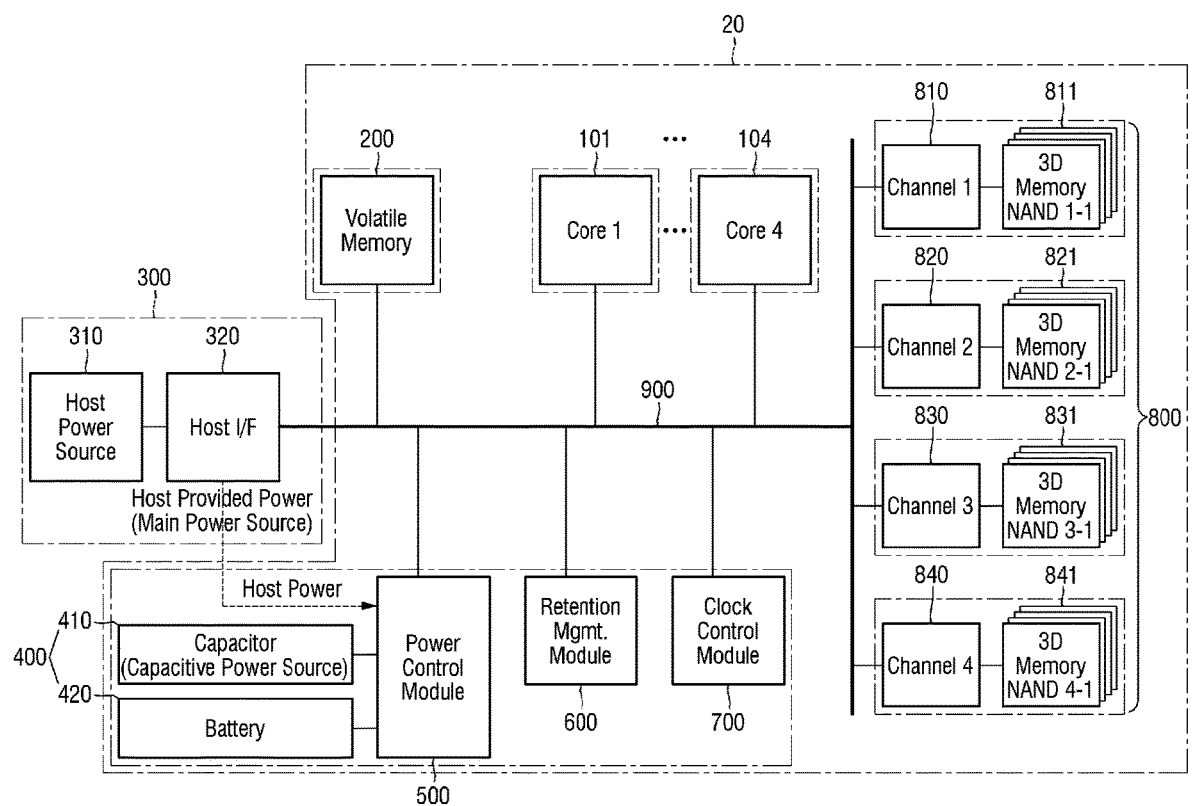
FIG. 1 is a block diagram of a storage device according to some exemplary embodiments of the present disclosure.
Figure 2:
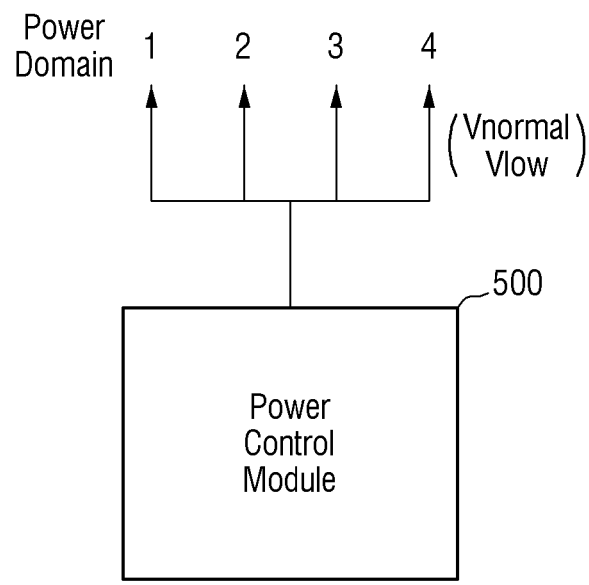
FIG. 2 is a block diagram of a power control module illustrated in FIG. 1 according to some exemplary embodiments.
Figure 3:
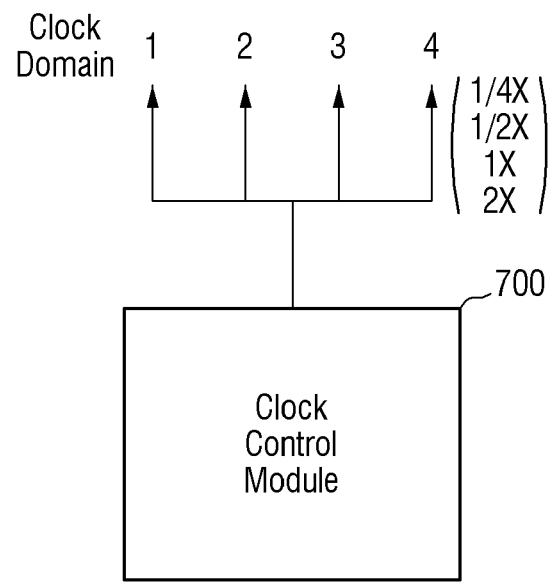
FIG. 3 is a block diagram of a clock control module illustrated in FIG. 1 according to some exemplary embodiments.
Figure 4:
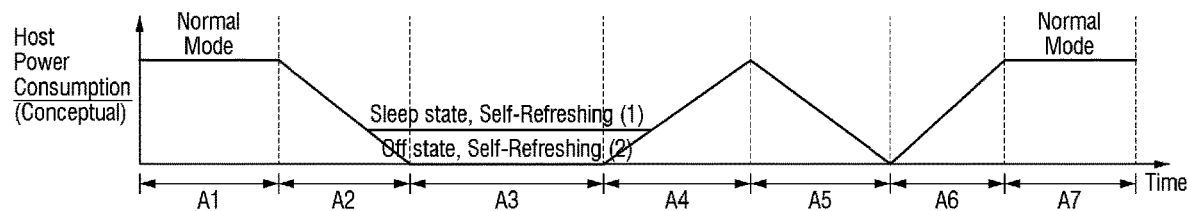
FIG. 4 is a graph for explaining various operating modes of the storage device of FIG. 1 for different amounts of power consumption.

FIG. 1 is a block diagram of a storage device according to some exemplary embodiments of the present disclosure, FIG. 2 is a block diagram of a power control module illustrated in FIG. 1 according to some exemplary embodiments, FIG. 3 is a block diagram of a clock control module illustrated in FIG. 1 according to some exemplary embodiments, and FIG. 4 is a graph showing various operating modes of the storage device of FIG. 1 for different amounts of power consumption.

Referring to FIGS. 1 through 4, a first storage device 20 according to some exemplary embodiments of the present disclosure may be connected to a host 300. The host 300 may control a data processing operation of the first storage device 20 (for example, a write operation or a read operation).

In some exemplary embodiments, the host 300 may be realized as a host processor, an integrated circuit (IC), a mother board, a system-on-chip (SoC), an application processor (AP), a mobile AP, a web server, a data server, or a database server, but the present disclosure is not limited thereto.

The host 300 includes a host power source 310 therein, and power (e.g., one or more power supplies) may be supplied to the entire host 300 and the first storage device 20 by the host power source 310. The host power source 310 may supply power to the first storage device 20 via a host interface 320. For example, the first storage device 20 may use power supplied from the host power source 310 as a main power.

The first storage device 20 may exchange instructions and/or data with the host 300 via the host interface 320. The first storage device 20 may be realized as a flash-based storage device, but the present disclosure is not limited thereto. Alternatively, the first storage device 20 may be realized as a solid-state drive or solid-state disk (SSD) or an embedded SSD (eSSD), but the present disclosure is not limited thereto.

The host 300 and the first storage device 20 may be connected to each other to form a single data processing system. The data processing system may be realized as, for example, a personal computer (PC), a workstation, a data center, an Internet data center (IDC), a direct attached storage (DAS) system, a storage area network (SAN) system, a network attached storage (NAS) system, a redundant array of inexpensive disks or redundant array of independent disks (RAID) system, or a mobile device, but the present disclosure is not limited thereto.

The mobile device may be realized as a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile Internet device (MID), a wearable computer, an Internet of things (IoT) device, an Internet of everything (IoE) device, a drone, or an electronic-book (e-book), but the present disclosure is not limited thereto.

The host interface 320 may be a path via which instructions and/or data are transmitted between the host 300 and the first storage device 20. In some exemplary embodiments, the host interface 320 may be realized as a serial advanced technology attachment (SATA) interface, a serial advanced technology attachment express (SATAe) interface, a serial attached small (SAS) computer system interface (SCSI), a peripheral component interconnect express (PCIe) interface, a nonvolatile memory express (NVMe) interface, an advanced host controller interface (AHCI), or a multimedia card (MMC) interface, but the present disclosure is not limited thereto.

In some exemplary embodiments, the host interface 320 may transmit electrical signals or optical signals.

The first storage device 20 includes a volatile memory 200, first, second, third, and fourth processing cores 101, 102, 103, and 104, a memory 800, an additional power module 400, a power control module 500, a clock control module 700, a retention management module 600, and a bus 900.

The embodiments are described, and illustrated in the drawings, in terms of functional blocks, parts, units and/or modules. These blocks, parts, units and/or modules may be physically implemented by electronic (or optical) circuits such as logic circuits, discrete components, microprocessors, hard-wired circuits, memory elements, wiring connections, and the like, which may be formed together in a single integrated circuit (e.g., as a single semiconductor chip) or as separate integrated circuits and/or discrete components (e.g., several semiconductor chips wired together on a printed circuit board) using semiconductor fabrication techniques and/or other manufacturing technologies. These blocks, parts, units and/or modules may be implemented by a processor (e.g., a microprocessor, a controller, a CPU, a GPU) or processors that are programmed using software (e.g., microcode) to perform various functions discussed herein. Each block, part, unit and/or module may be implemented by dedicated hardware, or as a combination of dedicated hardware to perform some functions and a processor to perform other functions. Also, each block, part, unit and/or module of the embodiments may be embodied by physically separate circuits and need not be formed as a single integrated.

The first, second, third, and fourth processing cores 101, 102, 103, and 104 may perform an operation of the first storage device 20 in the first storage device 20. Specifically, the first, second, third, and fourth processing cores 101, 102, 103, and 104 may perform an operation corresponding to a data processing command transmitted by the host 300, a refresh operation for the memory 800, and the like. In example embodiments, each of the first, second, third, and fourth processing cores 101, 102, 103, and 104 may be at least one of a controller, a processor, a central processing unit (CPU), a logic device, or a system on chip (SoC).

FIG. 1 illustrates an example in which fourth processing cores, i.e., the first, second, third, and fourth processing cores 101, 102, 103, and 104, are provided, but the present disclosure is not limited thereto. For another example, less than four or five or more processing cores may be provided.

The volatile memory 200 may perform an operation corresponding to a data processing command and a refresh operation for the memory 800. The volatile memory 200 may be, for example, a dynamic random access memory (DRAM). The volatile memory 200 may serve as a buffer memory for performing an operation corresponding to a data processing command and a refresh operation for the memory 800.

Data may be written to or read from the memory 800 in accordance with a request from the host 300. The memory 800 may be, for example, a flash memory. The memory 800 may include first, second, third, and fourth memory channels 810, 820, 830, and 840. The memory 800 is illustrated as having four memory channels, but the present disclosure is not limited thereto. For example, alternatively, the memory 800 may include less than four or five or more memory channels.

Each of the first, second, third, and fourth memory channels 810, 820, 830, and 840 may include a memory controller, and the memory controllers of the first, second, third, and fourth memory channels 810, 820, 830, and 840 may be connected to first, second, third, and fourth nonvolatile memories 811, 821, 831, and 841, respectively. The memory controllers of the first, second, third, and fourth memory channels 810, 820, 830, and 840 may control the transmission of instructions and/or data provided to the first, second, third, and fourth nonvolatile memories 811, 821, 831, and 841.

For example, the memory controllers of the first, second, third, and fourth memory channels 810, 820, 830, and 840 write data transmitted from the host 300 to the first, second, third, and fourth nonvolatile memories 811, 821, 831, and 841 and may transmit data read from the first, second, third, and fourth nonvolatile memories 811, 821, 831, and 841 to the host 300.

In example embodiments, each of the first, second, third, and fourth memory channels 810, 820, 830, and 840 may include a logic device, and the logic devices of the first, second, third, and fourth memory channels 810, 820, 830, and 840 may be connected to the first, second, third, and fourth nonvolatile memories 811, 821, 831, and 841, respectively. The logic devices of the first, second, third, and fourth memory channels 810, 820, 830, and 840 may control the transmission of instructions and/or data provided to the first, second, third, and fourth nonvolatile memories 811, 821, 831, and 841.

For example, the logic devices of the first, second, third, and fourth memory channels 810, 820, 830, and 840 write data transmitted from the host 300 to the first, second, third, and fourth nonvolatile memories 811, 821, 831, and 841 and may transmit data read from the first, second, third, and fourth nonvolatile memories 811, 821, 831, and 841 to the host 300.

At least the first, second, third, and fourth nonvolatile memories 811, 821, 831, and 841 may be connected to the first, second, third, and fourth memory channels 810, 820, 830, and 840, respectively. Specifically, the first memory channel 810 may be connected to at least one first nonvolatile memory 811, the second memory channel 820 may be connected to at least one second nonvolatile memory 821, the third memory channel 830 may be connected to at least one third nonvolatile memory 831, and the fourth memory channel 840 may be connected to at least one fourth nonvolatile memory 841.

In example embodiments, the refresh operation for the memory 800 may be performed on at least a part (e.g., a block or a page) of each of the first, second, third, and fourth nonvolatile memories 811, 821, 831, and 841. The refresh operation for the memory 800 may include a copy operation. For example, data may be programmed into a second page when a first page is failed.

Each of the first, second, third, and fourth nonvolatile memories 811, 821, 831, and 841 may include a three-dimensional (3D) negative-AND (NAND) flash memory array. The 3D NAND flash memory array is monolithically formed in one or more physical levels of arrays of memory cells having an active area disposed above a silicon substrate and circuitry associated with the operation of the memory cells, whether the associated circuitry is above or within a semiconductor (e.g., silicon) substrate. The term "monolithically," as used herein, means that layers of each level of the 3D NAND flash memory array are directly deposited on layers of a respective underlying level of the 3D NAND flash memory array.

In some exemplary embodiments, the 3D NAND flash memory array includes vertical NAND strings that are vertically oriented such that at least one memory cell is located over another memory cell. The at least one memory cell may comprise a charge trap layer. Each of the vertical NAND strings may include at least one selection transistor located above memory cells. The at least one selection transistor has the same structure as memory cells and may be formed monolithically together with memory cells.

The additional power module 400 may additionally supply power to the first storage device 20. When power supplied by the host power source 310 is insufficient or disconnected from the first storage device 20 (e.g., physically or electrically disconnected), the additional power module 400 may supply power to the first storage device 20.

The additional power module 400 may include a capacitor 410 and/or a battery 420. The capacitor 410 may be charged when power is supplied from the host 300 and may be discharged when the supply of power by the host 300 is reduced. The battery 420 may also be charged when power is supplied from the host 300 and may supply power to the first storage device 20 when the power supplied from the host 300 is reduced or disappears.

Since data may not be able to be protected by the capacitor 410 alone in the case where power is not supplied from the host 300, the battery 420 may be needed for the stable protection of data.

The power control module 500 may control power supplied to the first storage device 20. The power control module 500 may receive power from the host power source 310 and the additional power module 400 and may control the received power.

Referring to FIG. 2, the power control module 500 may control the supply of power to one or more power domains. For example, the power control module 500 may control the supply of power to first through fourth power domains. The term "power domain," as used herein, denotes areas (e.g., elements, pages, blocks, parts, units or circuits) supplied with power (e.g., one or more power supply voltages). For example, a first power supplied to a first power domain may differ from a second power supplied to a second power domain. For example, the first power supplied to a first power domain may be a first power supply voltage (e.g., 5V) and the second power supplied to a second power domain may be a second power supply voltage (e.g., 3V). As another example, the power supplied to the first power domain may include two or more power supply voltages.

In general, the term "circuitry" may be used herein to refer generally to any of the described circuits configured to perform certain functions, whether shown as part of the host 300, part of the first storage device 20, or part of another element.

The elements of the first storage device 20 may belong to one of the first through fourth clock domains and may use power supplied to one of the first through fourth clock domains. FIG. 2 illustrates an example in which there exists four power domains, but the present disclosure is not limited thereto. For example, there may exist less than four or five or more power domains.

The power control module 500 may supply power at a normal voltage Vnormal or a low voltage Vlow to each of the first through fourth power domains, but the present disclosure is not limited thereto. As an example, the power control module 500 may supply the normal voltage Vnormal (e.g., 5V) to the first power domain in a normal mode and the power control module 500 may supply the low voltage Vlow (e.g., 3V) to the first power domain in a low power mode. As another example, the power control module 500 may supply three or more power supply voltages to each of the first through fourth power domains. The first storage device 20 may operate in the low power mode when power is not supplied from the host 300. For example, one or more power domains may not be used in the low power mode.

The normal voltage Vnormal may be a voltage supplied normally to each power domain in the case where power is supplied from the host 300. On the other hand, the low voltage Vlow may be a voltage used in a low power mode that will be described later.

The power control module 500 may include a battery level indicator showing the remaining power of the battery 420. The power control module 500 may report the state of the battery 420 to the host 300 via the host interface 320 or may display the remaining power of the battery 420 to a user. The battery level indicator of the power control module 500, which displays the remaining power of the battery 420 to the user, may be, for example, a light-emitting diode (LED) display, but the present disclosure is not limited thereto.

The power control module 500 may control the recharging of the battery 420 and the capacitor 410. For example, the power control module 500 may control the recharging of the additional power module 400 by the host power source 310.

Referring to FIG. 3, the clock control module 700 may control the supply of a clock to one or more clock domains. For example, the clock control module 700 may control the supply of a clock to first through fourth clock domains of FIG. 3. The term "clock domain," as used herein, denotes areas (e.g., elements, blocks, parts, units or circuits) provided with one or more clock signals, and the frequency of the one or more clock signals supplied may vary.

The elements of the first storage device 20 may belong to one of the first through fourth clock domains and may use power supplied to one of the first through fourth power domains. FIG. 3 illustrates an example in which there exists four clock domains, but the present disclosure is not limited thereto. In another example, there may exist less than four or five or more clock domains.

The clock control module 700 may supply one of four clocks ¼×, ½×, 1×, and 2× having different frequencies to each clock domain. FIG. 3 illustrates an example in which a total of four clocks are provided, but the present disclosure is not limited thereto. For another example, the clock control module 700 may supply a clock to each clock domain at more than four frequencies.

The clocks 1× and 2×, which have a relatively high frequency, may be, but are not limited to, clocks supplied to each clock domain when power is supplied from the host 300. On the other hand, the clocks ½× and ¼×, which have a relatively low frequency, may be, but are not limited to, clocks used in the low power mode that will be described later.

Referring again to FIG. 1, when the memory 800, i.e., a flash memory cell (e.g., a NAND-type flash memory cell), is left alone (which may be described as being powered off) for a long period of time after the storing of charges (or information corresponding to the charges) in a floating gate or a charge trap layer of the flash memory cell, the charges stored in the floating gate or the charge trap layer may be lost or leaked. When a flash memory cell (e.g., a NAND-type flash memory cell) is left alone for a long period of time, electrons leak out, degrading a distribution. This characteristic is referred to as a retention characteristic.

A memory cell with weak retention time may generate an error bit due to retention. When a read operation is repeatedly performed on this memory cell, the threshold voltage of the memory cell may decrease.

In order to strengthen the retention characteristic of the first storage device 20, the first storage device 20 may include the retention management module 600 so as to be able to perform a self-refresh operation.

The retention management module 600 may control a refresh operation for data stored in the memory 800 when there is no power supplied from the host 300.

Specifically, the retention management module 600 may log one or more parameters for refreshing the data stored in the memory 800. The parameters may include, for example, at least one of an erase count, program time, erase time, a read count, current temperature data, previous temperature data, and temperature variation data, but the present disclosure is not limited thereto.

The parameters may be used to select a target refresh area later or to set a wake-up time for a refresh operation.

The retention management module 600 may perform a refresh operation for the memory 800 by waking itself up when there is no power supplied from the host 300. Accordingly, the retention management module 600 may set a wake-up time in advance. A wake-up time may be set periodically. The retention management module 600 may have a predetermined wake-up period. Alternatively, the wake-up period of the retention management module 600 may be changed in accordance with changes in the parameters.

In example embodiments, one or more parts (e.g., elements, blocks, units or circuits) of the first storage device 20 may operate by the retention management module 600 periodically woken-up to refresh at least a part (e.g., a portion of memory cells) of the memory 800. For example, the refresh operation may be performed in a low power mode while the power is disconnected from the host 300.

The host 300 may set the wake-up time of the first storage device 20 via the host interface 320.

The retention management module 600 may determine which part of the memory 800 is to be refreshed. For example, the retention management module 600 may set a target refresh area.

The retention management module 600 may select a minimum resource combination to refresh the target refresh area. The term "minimum resource combination," as used herein, denotes a combination of minimum hardware and software resources to refresh the target refresh area. Hardware resources may refer to, for example, a processing core, a volatile memory, a nonvolatile memory, and the like.

As an example, the first storage device 20 may select at least one of the first, second, third, and fourth processing cores 101, 102, 103, and 104, the volatile memory 200, at least one of the first, second, third, and fourth memory channels 810, 820, 830, and 840, and at least one of the first, second, third, and fourth nonvolatile memories 811, 821, 831, and 841 as the minimum resource combination.

The software resources in the minimum resource combination may refer to software elements designated to make a code implementation for executing the hardware resources in the minimum resource combination consume a minimum amount of power.

The retention management module 600 may set the minimum resource combination to operate in the low power mode. The low power mode refers to an operating mode in which the first storage device 20 consumes a minimum amount of power by using the low voltage Vlow of FIG. 2 and the low-frequency clocks ½× and/or ¼× of FIG. 3.

The retention management module 600 may perform an emergency backup operation in the case where the battery 420 is suddenly powered off or the amount of power of the battery 420, identified by the power control module 500, is less than a reference level. For example, the retention management module 600 may store refresh context including data that needs to be refreshed and/or system status log data in the nonvolatile memory included in the minimum resource combination.

The retention management module 600 of the first storage device 20 may change policies so that the first storage device 20 can consume less power than in the low power mode when the remaining power of the battery 420, identified by the power control module 500, is less than the reference level.

The retention management module 600 may dynamically define the priorities among refresh areas, criteria for selecting a target refresh area, the size of copy units used in a refresh operation, criteria for selecting the minimum resource combination, a clock frequency, and the expected power consumption and the voltage of the additional power module 400 by reflecting the refresh context, the parameters, the results of a previous refresh operation, and any progress in a current refresh operation.

The bus 900 may connect the host interface 320, the volatile memory 200, the first, second, third, and fourth processing cores 101, 102, 103, and 104, the memory 800, the power control module 500, the clock control module 700, and the retention management module 600. For example, the transfer of data and requests may all be conducted via the bus 900.

Various operations of the first storage device 20 will hereinafter be described with reference to FIG. 4. FIG. 4 is a graph for explaining various operating modes of the first storage device 20 in accordance with the supply of power from the host 300.

When sufficient power is supplied from the host 300, the first storage device 20 may operate in a normal mode, and when the supply of power from the host 300 is reduced below a predetermined reference level, the first storage device 20 may operate in a sleep state. When there is no power supplied from the host 300, the first storage device 20 may operate in an off state. In the off state, the power may be disconnected from the host 300 while still physically connected (e.g., power is electrically disconnected), or while physically disconnected.

FIG. 4 shows first and seventh periods A1 and A7 in which the first storage device 20 operates in the normal mode, second and fifth periods A2 and A5 in which the transition of the operating mode of the first storage device 20 from the normal mode to the sleep state or the off state takes place, a third period A3 in which the first storage device 20 operates in the sleep state or the off state, and a sixth period A6 in which the transition of the operating mode of the first storage device 20 from the sleep state or the off state to the normal mode takes place.

Table 1 below shows operations of the first storage device 20 in the first through seventh periods A1 through A7.

TABLE 1

|  | A1 | A2 | A3 | A4 | A5 | A6 | A7 |
|---|---|---|---|---|---|---|---|
| Power Source | Host power source | Host power source → Capacitor | (1) Host power source (2) Battery | Host power source | Host power source → Capacitor or battery (if capacitor voltage is low) | Host power source | Host power source |
| Additional Power Module Charge | Charge capacitor and battery | Discharge capacitor | — | Charge capacitor | — | Charge capacitor | Charge capacitor and battery |
| Storage Device Operation | Normal I/O operation and background operation | (1) Prepare sleep state (2) Prepare off state | (1) Self-refresh (2) Self-refresh | (1) Restore from sleep state (2) Booting | Prepare off state | Booting | Normal I/O operation and background operation |
| Environmental Parameters | Log and update | Log | Log and update | — | Log | — | Log and update |
| Operating | All (Normal) | All (Power | (1) Reduced | All (Power | All (Power | All | All |

TABLE 1-continued

|  | A1 | A2 | A3 | A4 | A5 | A6 | A7 |
| --- | --- | --- | --- | --- | --- | --- | --- |
| Resources |  | decreases) | Configuration (Sleep State) (2) Minimum Configuration (Low power mode) | increases) | decreases) | (Power increases) | (Normal) |
| Refresh Policies | Refresh by host power | — | (1) Priority policy (Sleep state) (2) Priority policy (Battery normal) | — | — | — | Refresh by host power |
| Low Battery Backup | — | — | Backup | — | — | — | — |
| Periodic Refresh | Refresh by host power | — | Periodic wake-up and refresh (in consideration of parameters) | — | — | — | Refresh by host power |
| Remaining Battery Power Display | Report battery level to host | — | Means for displaying remaining battery power |  |  |  | Report battery level to host |
| Host Interface | (Optional) Set self-refresh policy via host |  |  |  |  |  | (Optional) Set self-refresh policy via host |

Referring to Table 1 and FIG. 4, in the first and seventh periods A1 and A7, the first storage device 20 may be supplied with power by the host power source 310, and the capacitor 410 and the battery 420 may be charged. The first storage device 20 may perform a normal input/output (I/O) operation and a background operation, and environmental parameters may be logged and updated. The environmental parameters may include the current and previous temperatures and temperature variation data of the memory 800.

Not some, but all, of the resources of the first storage device 20 may generally operate. In this case, a refresh operation may be performed by power supplied from the host 300. The remaining power of the battery 420 may be reported to the host 300. In the first and seventh periods A1 and A7, a policy for a self-refresh of the first storage device 20 may be set via the host interface 320, but the present disclosure is not limited thereto. Alternatively, the policy for a self-refresh of the first storage device 20 may be set by the first storage device 20.

In the second and fifth periods A2 and A5, since power supplied from the host 300 is reduced, the source of power may be switched from the host power source 310 to the capacitor 410. In this case, the capacitor 410 may be discharged to supply power to the first storage device 20. If there is no time for the capacitor 410 to be charged as in the fifth period A5, the supply of power may be performed by the battery 420.

When the first storage device 20 enters the sleep state (1), the first storage device 20 may prepare the sleep state, and when the first storage device 20 enters the off state (2), the first storage device 20 may prepare the off state. The preparation of the sleep state may be included in the preparation of the off state. The environmental parameters may be logged, but not updated. Since the second period A2 is a relatively short period when power decreases, the update of parameters may be limited. Not all, but some, of the resources of the first storage device 20 may operate, but power may gradually decrease.

In the third period A3, in the sleep state (1), the first storage device 20 may be driven by the host power source 310. In the off state (2), the first storage device 20 may be driven by the battery 420.

In the third period A3, the first storage device 20 may perform only a self-refresh operation. In this case, the environmental parameters may be logged and updated. The resources of the first storage device 20 may have a reduced configuration (for the sleep state) or the minimum resource combination (for the off state) depending on the power of the first storage device 20, and a refresh policy may include an appropriate priority policy accordingly.

When the battery 420 is powered off or has a voltage lower than a reference level, an emergency backup operation may be performed. In the third period A3, the first storage device 20 may be periodically woken up to perform a refresh operation. The intervals at which the first storage device 20 is woken up may be controlled by the environmental parameters.

In the third period A3, the remaining power of the battery 420 may be displayed directly to a user. The first storage device 20 may include means for displaying the remaining power of the battery 420.

In the fourth and sixth periods A4 and A6, the first storage device 20 may be supplied with power by the host power source 310, and the capacitor 410 may be charged. In this case, the first storage device 20 may be restored from the sleep state (1) or may be booted from the off state (2).

Not some, but all, of the resources of the first storage device 20 may operate, but the power of the first storage device 20 may gradually increase.

The first storage device 20 includes the retention management module 600 and can thus refresh data stored in the memory 800 even when there is no power supplied from the host 300. Since this type of refresh operation is for the case where there is no sufficient power, a minimum amount of power needs to be consumed using a minimum amount of resources, and by doing so, data loss can be prevented, and at the same time, the retention characteristic of the first storage device 20 can be improved.

A refresh method of a storage device according to some exemplary embodiments of the present disclosure will hereinafter be described with reference to FIGS. 1 and 4 through 6, avoiding any redundant description.

Figure 5:
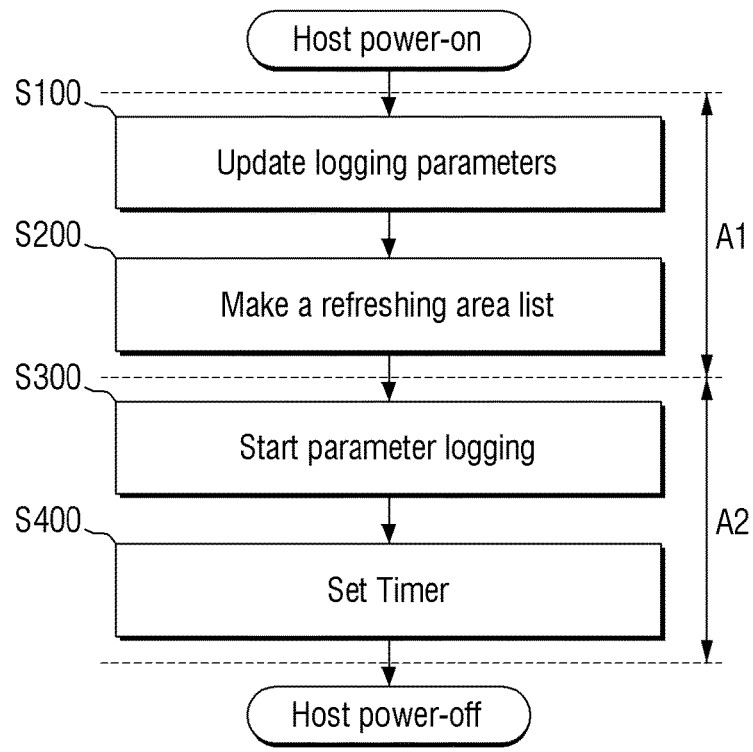
FIG. 5 is a flowchart illustrating a refresh method of a storage device according to some exemplary embodiments of the present disclosure.

FIG. 5 is a flowchart illustrating a refresh method of a storage device according to some exemplary embodiments of the present disclosure, and FIG. 6 is a table showing a refresh area list used in the method of FIG. 5.

It will hereinafter be described how the retention management module 600 of the first storage device 20 operates in the first and second periods A1 and A2 with reference to FIGS. 1, 4, and 5. S100 and S200 of FIG. 5 may correspond to the first and seventh periods A1 and A7 of FIG. 4, and S300 and S400 of FIG. 5 may correspond to the second and fifth periods A2 and A5 of FIG. 4.

Parameters that are previously logged when there is power supplied from the host 300 are updated (S100).

The retention management module 600 may log parameters in advance and may update the parameters while the first storage device 20 is operating in the normal mode as in the first period A1.

The parameters include the environmental parameters, and may include at least one of an erase count, program time, erase time, a read count, current temperature data, previous temperature data, and temperature variation data, but the present disclosure is not limited thereto.

Thereafter, a refresh area list is created (S200).

The retention management module 600 may create the refresh area list. FIG. 6 shows an exemplary refresh area list.

Referring to FIG. 6, the refresh area list may include the area identifier, start and end physical addresses, area size, minimum refresh period, refresh priority level, refresh policy, health status, erase count, program time, program temperature, and temperature average rate of change of each refresh area.

A refresh policy may indicate whether to perform a refresh operation either dynamically by newly checking the priority level of each refresh area whenever the first storage device 200 is woken up or statically according to the priority level of each refresh area, determined in advance.

A health status may be calculated based on, for example, average bit error rate, but the present disclosure is not limited thereto.

The retention management module 600 may select an area to be refreshed, i.e., a target refresh area, based on the refresh area list, and may set a wake-up period. For example, the wake-up cycle and a refresh period may be set or changed based on a minimum check period and in consideration of a health status and the like.

Referring again to FIG. 5, the logging of the parameters is started (S300).

The first period A1 is a period during which the parameters frequently change because of read and write operations for the first storage device 20. On the other hand, in the second period A2, read and write operations are not performed, and thus, the logging of the parameters, but not the update of the parameters, is needed. Accordingly, the retention management module 600 may newly log the parameters without any read and write operations.

Thereafter, a timer is set (S400).

The retention management module 600 may determine the time to be woken up in advance before the first storage device 20 is switched to the off state. For example, the timer may be a timer for determining a wake-up time. Accordingly, when the first storage device 20 is switched to the off state, the wake-up time may be set by the timer.

A refresh method of a storage device according to some exemplary embodiments of the present disclosure will hereinafter be described with reference to FIGS. 1 through 4 and 7 through 9, avoiding any redundant description.

Figure 7:
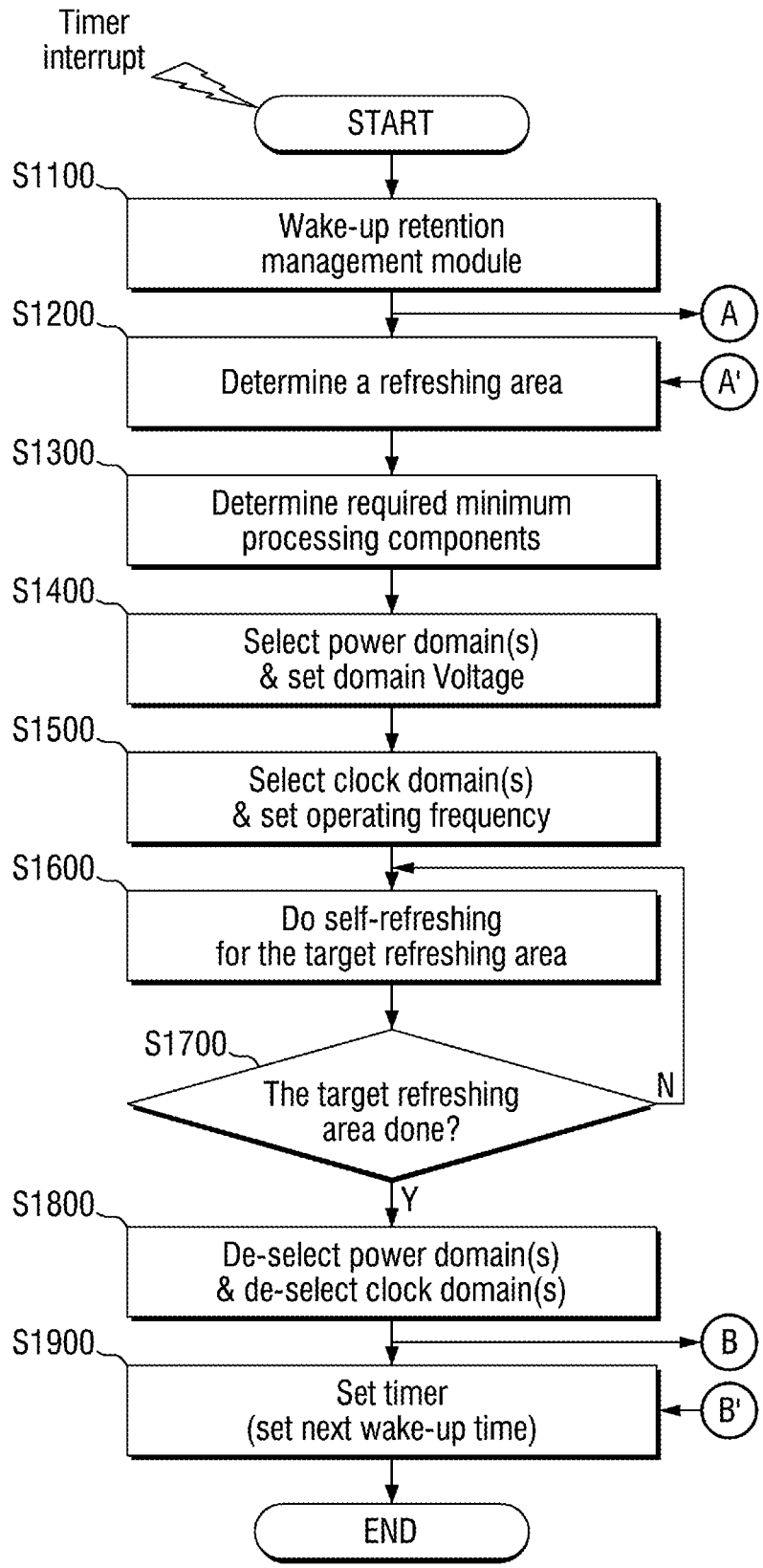
FIG. 7 is a flowchart illustrating a refresh method of a storage device according to some exemplary embodiments of the present disclosure.
Figure 8:
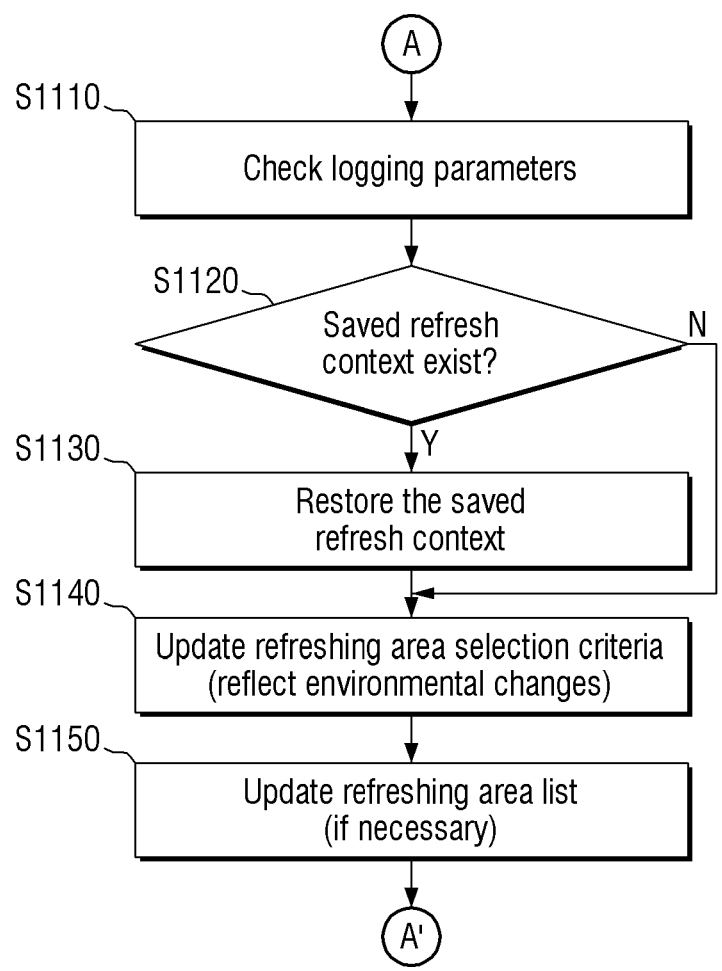
FIG. 8 is a flowchart illustrating the restoration of refresh information as performed in the refresh method of a storage device according to some exemplary embodiments of the present disclosure.
Figure 9:
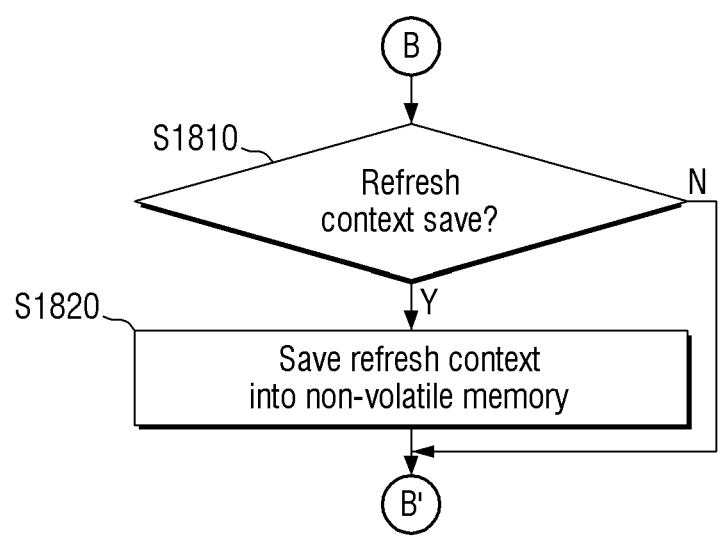
FIG. 9 is a flowchart illustrating the storing of refresh information as performed in the refresh method of a storage device according to some exemplary embodiments of the present disclosure.

FIG. 7 is a flowchart illustrating a refresh method of a storage device according to some exemplary embodiments of the present disclosure, and FIG. 8 is a flowchart illustrating the restoration of refresh information as performed in the refresh method of a storage device according to some exemplary embodiments of the present disclosure. FIG. 9 is a flowchart illustrating the storing of refresh information as performed in the refresh method of a storage device according to some exemplary embodiments of the present disclosure.

Referring to FIGS. 1 through 4 and 7, when the first storage device 20 reaches the off state, the retention management module 600 is woken up by a previously-set time interrupt (S1100).

The wake-up time of the retention management module 600 may be determined in advance by the timer set in S400.

Thereafter, a target refresh area is selected (S1200).

The retention management module 600 may decide which part of the memory 800 is to be refreshed. For example, the retention management module 600 may select the target refresh area. The selection of the target refresh area may be performed based on parameters (e.g., logged or updated parameters).

Thereafter, a minimum resource combination is selected (S1300).

The retention management module 600 may select a minimum resource combination for a refresh operation. The minimum resource combination may consume less power than the power consumed by the resources of the first storage 20 while power is supplied from the host 300.

Thereafter, a minimum number of power domains for supplying power to the minimum resource combination are selected, and a domain voltage is determined (S1400).

In S1400, power may not necessarily be supplied to all power domains by the power control module 500, but may be supplied only to the minimum number of power domains for supplying power to the minimum resource combination. Also, power at the low voltage Vlow, which is lower than the normal voltage Vnormal, may be supplied.

Thereafter, a minimum number of clock domains for supplying power to the minimum resource combination are selected, and a clock frequency is determined (S1500).

In S1500, one or more clocks may not necessarily be supplied to all clock domains by the clock control module 700, but may be supplied only to the minimum number of clock domains for supplying one or more clocks to the minimum resource combination. Also, a relatively low-frequency clock may be applied.

The low voltage Vlow and the low-frequency clock may be set in advance for a low power mode.

FIG. 7 illustrates S1400 and S1500 as being performed one after another in a time-series manner, but the present disclosure is not limited thereto. For example, alternatively, S1400 and S1500 may be performed at the same time or may be performed in the opposite order to that illustrated in FIG. 14.

Thereafter, a refresh operation is performed (S1600).

The retention management module 600 may refresh the target refresh area in the low power mode using the minimum resource combination. Accordingly, the reliability of data present in the first storage device 20 can be efficiently maintained for as long a period of time as possible even when there is no power supplied from the host 300.

Thereafter, a determination is made as to whether the refreshing of the target refresh area is completed (S1700).

When the refreshing of the target refresh area is completed, the selected power domains and the selected clock domains are deselected (S1800).

Thereafter, the timer is set (S1900).

The retention management module 600 may determine a next wake-up time. For example, the timer may be a timer for determining a wake-up time. A wake-up time may be set periodically. The wake-up period of the retention management module 600 may be changed in accordance with the parameters.

"A" of FIG. 7, which is performed between S1100 and S1200, will hereinafter be described with reference to FIGS. 1 through 8.

The retention management module 600 may check the parameters logged after S1100 (S1110).

The checked parameters may be taken into consideration when determining a target refresh area and a wake-up period later.

Thereafter, a determination is made as to whether there exists refresh context previously stored (S1120).

Refresh context may be created by an emergency backup operation when the power of the battery 420 is below a reference level. Refresh context may include data that needs to be refreshed and/or system status log data.

Alternatively, even when an emergency backup operation is not performed, refresh context including information regarding a refresh operation may be stored before the completion of the refresh operation.

If there exists refresh context previously stored, the previously-stored refresh context is restored (S1130).

As a result, a refresh area that has not been fully refreshed due to an emergency backup operation may be taken into consideration in the restored refresh context.

Thereafter, criteria for selecting a target refresh area are changed in accordance with changes in the environment (S1140).

In this case, the checked parameters and the restored refresh context may be considered as the changes in the environment.

If there does not exist any refresh context previously stored, S1130 may be skipped, and the criteria for selecting a target refresh area may be changed only in consideration of the checked parameters.

Thereafter, the refresh area list is updated (S1150).

As shown in FIG. 6, the refresh area list includes various information, and the information included in the refresh area list may be updated by the parameters and refresh context.

Thereafter, referring to FIG. 7, a target refresh area may be selected (S1200).

Alternatively, the target refresh area may be selected without using the refresh area list, in which case, S1150 may be omitted.

"B" of FIG. 7, which is performed between S1800 and S1900, will hereinafter be described with reference to FIGS. 1 through 9.

After a refresh operation is performed in S1600 and S1700, the selected power domains and the selected clock domains are deselected (S1800). Thereafter, a determination is made as to whether to store refresh context (S1810).

Specifically, a determination is made as to whether to store refresh context in consideration of the remaining power of the battery 420. Alternatively, once a refresh operation is completed, refresh context including information regarding the refresh operation may be stored unconditionally.

If a determination is made that refresh context needs to be stored, refresh context is stored in the memory 800 included in the minimum resource combination (S1820).

Thereafter, the timer is set (S1900).

On the other hand, if a determination is made that refresh context does not need to be stored, S1820 may be skipped, and S1900 may be performed.

In the refresh method of a storage device according to the exemplary embodiment of FIG. 7, the first storage device 20 can refresh itself in the low power mode using a minimum amount of resources (or, minimum resource combination) even when there is no power supplied from the host 300. Thus, the reliability of data present in the first storage device 20 can be effectively enhanced.

The various operations of methods described above may be performed by any suitable means capable of performing the operations, such as various hardware and/or software component(s), circuits, and/or module(s).

The software may comprise an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

A refresh method of a storage device according to some exemplary embodiments of the present disclosure will hereinafter be described with reference to FIG. 10, avoiding any redundant description.

Figure 10:
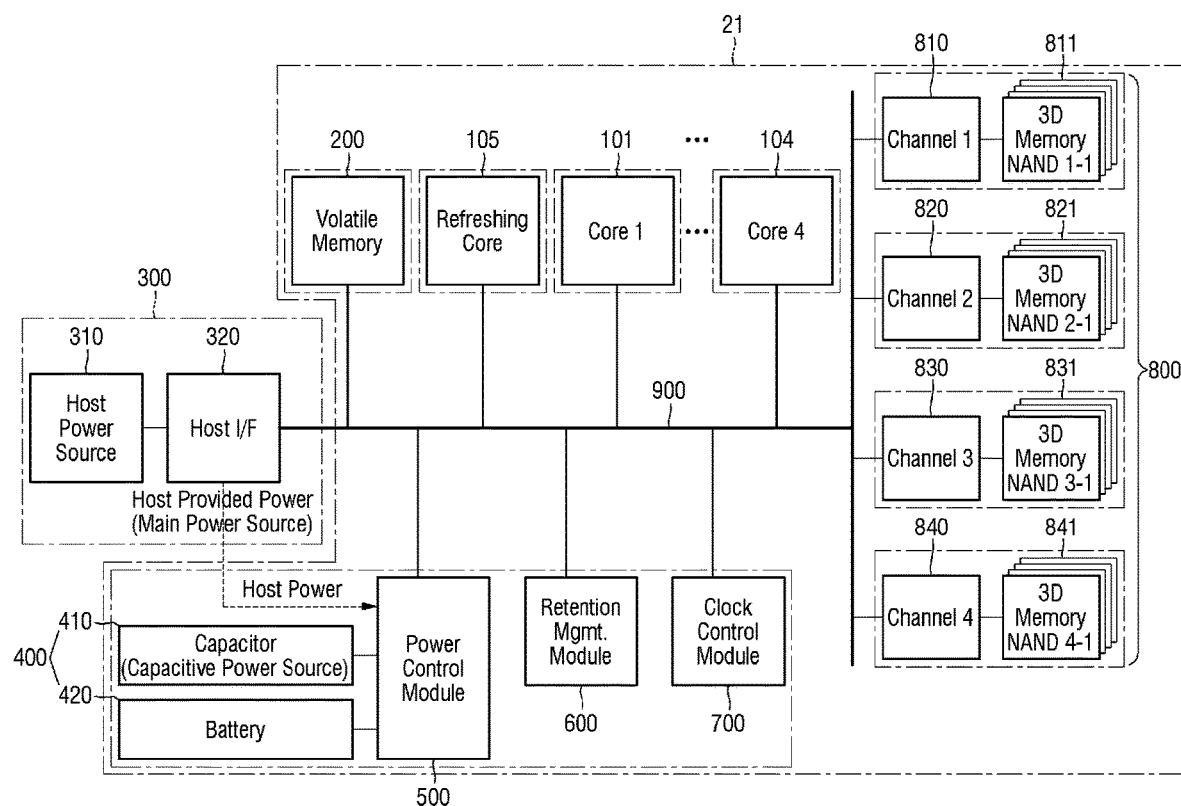
FIG. 10 is a block diagram of a storage device according to some exemplary embodiments of the present disclosure.

FIG. 10 is a block diagram of a storage device according to some exemplary embodiments of the present disclosure.

Referring to FIG. 10, a second storage device 21 according to some exemplary embodiments of the present disclosure, unlike the first storage device 20 of FIG. 1, may further include a refreshing core 105.

The refreshing core 105 may use a clock of a lower frequency than first, second, third, and fourth processing cores 101, 102, 103, and 104. Accordingly, the refreshing core 105 may operate at a lower speed than the first, second, third, and fourth processing cores 101, 102, 103, and 104. As a result, the refreshing core 105 may consume less power than the first, second, third, and fourth processing cores 101, 102, 103, and 104.

The refreshing core 105 may be a processing core exclusive for performing a refresh operation when there is no power supplied from a host 300. For example, a retention management module 600 may control the refreshing core 105 in a minimum resource combination. Accordingly, when there is no power supplied from the host 300, a memory 800 can be refreshed by consuming less power. For example, the refreshing core 105 is only required to perform a self-refresh operation (i.e., a refresh operation performed by the second storage device 21 without the need of power supplied from the host 300) and is thus not required to have a higher performance than necessary. Thus, the second storage device 21 can perform a high-efficiency self-refresh operation.

A refresh method of a storage device according to some exemplary embodiments of the present disclosure will hereinafter be described with reference to FIG. 11, avoiding any redundant description.

Figure 11:
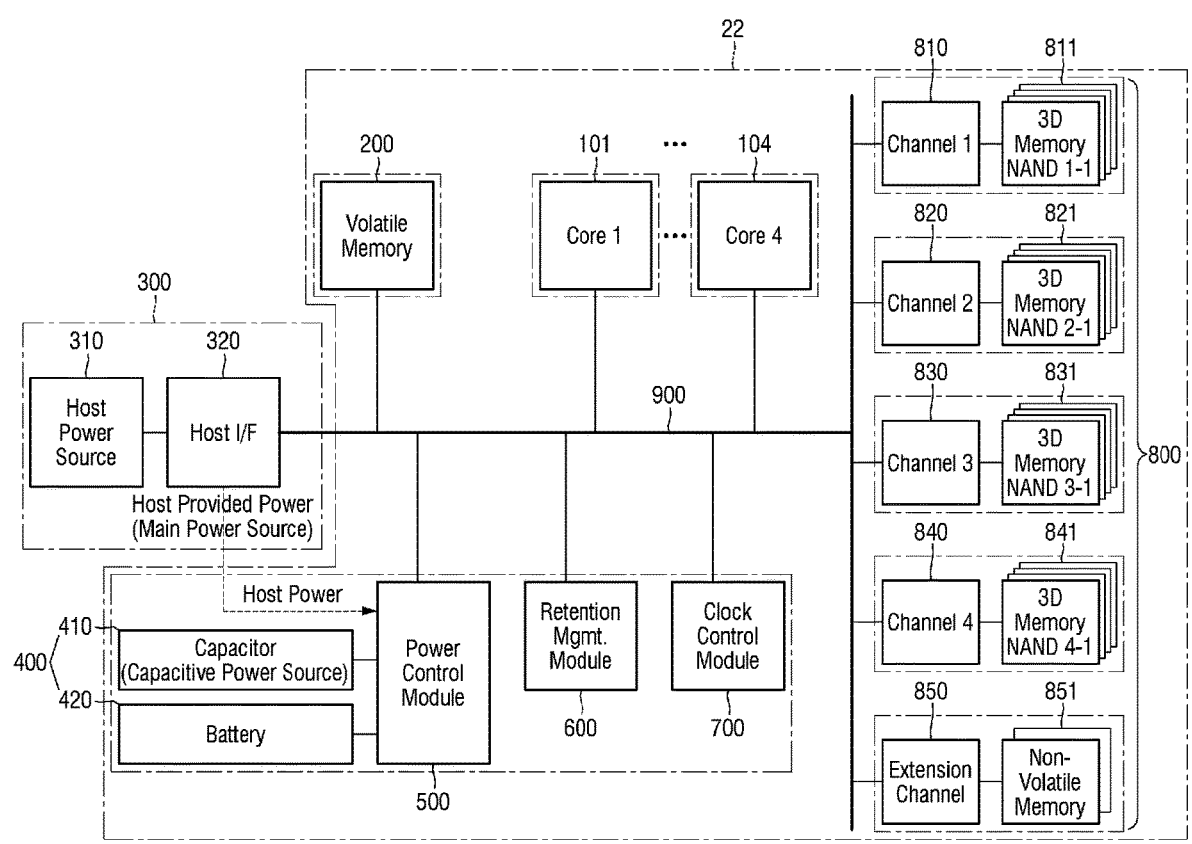
FIG. 11 is a block diagram of a storage device according to some exemplary embodiments of the present disclosure.

FIG. 11 is a block diagram of a storage device according to some exemplary embodiments of the present disclosure.

Referring to FIG. 11, a third storage device 22, unlike the first storage device 20 of FIG. 1, may further include an additional memory channel 850 and an exclusive nonvolatile memory 851.

The additional memory channel 850 may include a memory controller and may be connected to the exclusive nonvolatile memory 851. The memory controller of the memory channel 850 may control the transmission or the processing of instructions and/or data provided to the exclusive nonvolatile memory 851.

The exclusive nonvolatile memory 851 may use a clock of a lower frequency than first, second, third and fourth nonvolatile memories 811, 821, 831, and 841. Accordingly, the exclusive nonvolatile memory 851 may operate at a lower speed than the first, second, third and fourth nonvolatile memories 811, 821, 831, and 841. As a result, the exclusive nonvolatile memory 851 may consume less power than the first, second, third and fourth nonvolatile memories 811, 821, 831, and 841.

The exclusive nonvolatile memory 851 may be a nonvolatile memory exclusive for performing a refresh operation when there is no power supplied from a host 300. For example, a retention management module 600 may control the exclusive nonvolatile memory 851 in a minimum resource combination. Accordingly, when there is no power supplied from the host 300, the first, second, third and fourth nonvolatile memories 811, 821, 831, and 841 can be refreshed by consuming less power. In this case, the exclusive nonvolatile memory 851 is only required to perform a self-refresh operation (i.e., a refresh operation performed by the third storage device 22 without the need of power supplied from the host 300) and is thus not required to have a higher performance than necessary. Thus, the third storage device 22 can perform a high-efficiency self-refresh operation.

Emergency backup data such as refresh context may be stored in the exclusive nonvolatile memory 851, but the present disclosure is not limited thereto.

The exclusive nonvolatile memory 851 may be a high-speed nonvolatile memory having a faster speed than the first, second, third, and fourth nonvolatile memories 811, 821, 831, and 841.

A wake-up period can be minimized by minimizing the amount of time that it takes to perform a refresh operation, and as a result, the power consumption of the third storage device 22 can be lowered.

A refresh method of a storage device according to some exemplary embodiments of the present disclosure will hereinafter be described with reference to FIG. 12, avoiding any redundant description.

Figure 12:
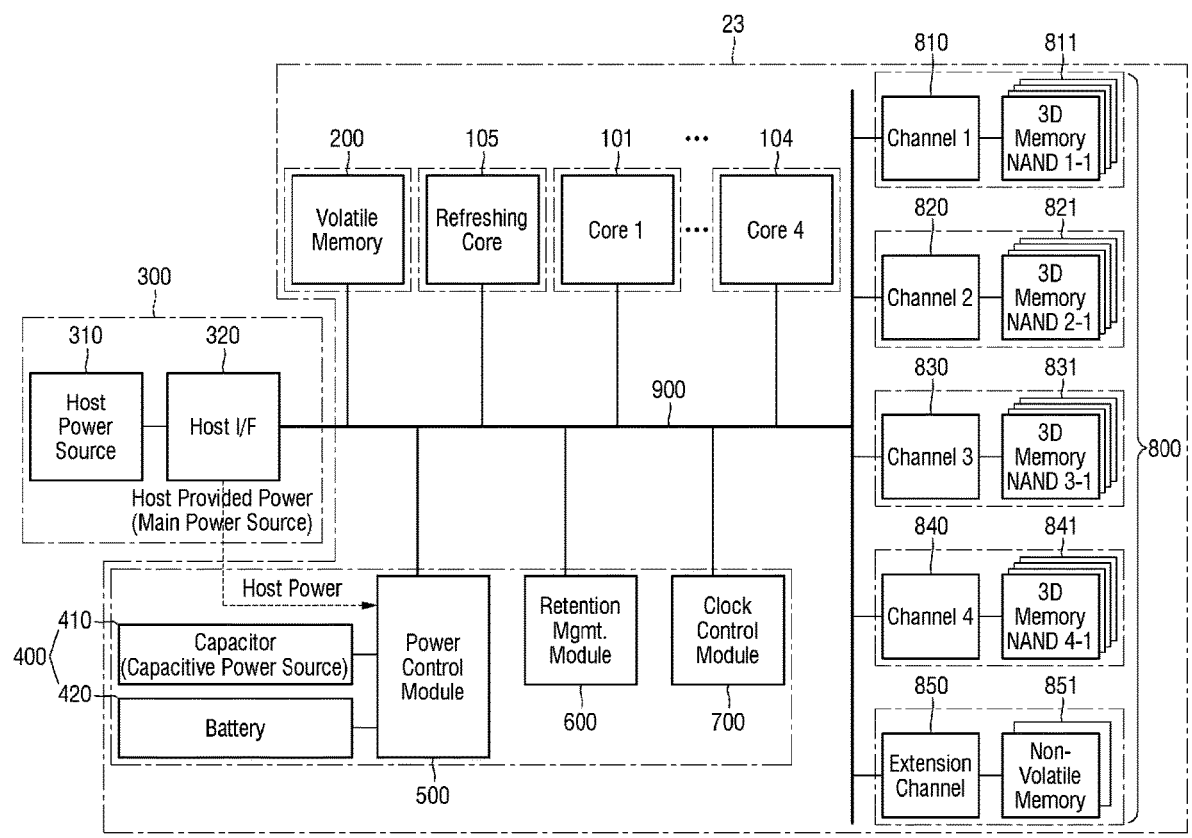
FIG. 12 is a block diagram of a storage device according to some exemplary embodiments of the present disclosure.

FIG. 12 is a block diagram of a storage device according to some exemplary embodiments of the present disclosure.

Referring to FIG. 12, a fourth storage device 23 according to some exemplary embodiments of the present disclosure, unlike the first storage device 20 of FIG. 1, may further include a refreshing core 105, which is the same as its counterpart of FIG. 10, and an additional memory channel 850 and an exclusive nonvolatile memory 851, which are the same as their respective counterparts of FIG. 11.

A retention management module 600 may control to include the refreshing core 105, the additional memory channel 850, and the exclusive nonvolatile memory 851 in a minimum resource combination. Accordingly, when there is no power supplied from the host 300, a memory 800 can be refreshed by consuming less power.

Since most of the elements of the minimum resource combination are already determined, a power control module 500 may set the refreshing core 105, the additional memory channel 850, and the exclusive nonvolatile memory 851 as the same power domain. Also, the clock control module 700 may set the refreshing core 105, the additional memory channel 850, and the exclusive nonvolatile memory 851 as the same clock domain.

Accordingly, the fourth storage device 23 can perform a self-refresh operation by consuming less power.

As described above, example embodiments have been disclosed in the drawings and specification. While the embodiments have been described herein with reference to specific terms, it should be understood that they have been used only for the purpose of describing the technical idea of the inventive concept and not for limiting the scope of the inventive concept as defined in the claims. Therefore, it will be clearly understood by one of ordinary skill in the art that various modifications and equivalent embodiments are possible without departing from the scope of the inventive concept.

What is claimed is:

1. A storage device comprising:
at least a first processing core configured to operate by receiving power from a first power from a host;
a second processing core separate from the first processing core;
at least a first three-dimensional (3D) flash memory;
a power module; and
a retention management module, wherein the retention management module is configured to, when the first power is not supplied from the host, be woken up periodically, and is configured to, when woken up, refresh a part of the first 3D flash memory using the second processing core by receiving power from a second power from the power module.

2. The storage device of claim 1, wherein a voltage level of the second power is less than a voltage level of the first power.

3. The storage device of claim 1, wherein the retention management module is configured to log parameters and select the part of the first 3D flash memory as a target refresh area based on the logged parameters.

4. The storage device of claim 3, wherein the parameters include at least one of an erase count, program time, erase time, a read count, current temperature data, previous temperature data, and temperature variation data.

5. The storage device of claim 3,
wherein the retention management module is configured to be woken up periodically with a first period of time, and
wherein the retention management module is configured to reset the first period of time based on the logged parameters.

6. The storage device of claim 1, further comprising:
a power control module configured to control the supply of power from the host and the power module,
wherein an area to which the power control module supplies power is divided into a plurality of power domains, and wherein the power supplied by the power control module includes a first voltage of the first power and a second voltage of the second power lower than the first voltage.

7. The storage device of claim 6,
wherein a first set of circuits of the storage device is configured to be supplied with the first voltage and a second set of circuits of the storage device including the second processing core is configured to be supplied with the second voltage, and
wherein the number of the second set of circuits is less than the number of the first set of circuits.

8. The storage device of claim 1, further comprising:
a clock control module configured to generate one or more clock signals,
wherein an area to which the clock control module transmits the one or more clock signals is divided into a plurality of clock domains, and
wherein the one or more clock signals include a first frequency and a second frequency lower than the first frequency.

9. The storage device of claim 8,
wherein a first set of circuits of the storage device is configured to receive a clock signal having the first frequency and a second set of circuits of the storage device including the second processing core is configured to receive a clock signal having the second frequency, and
wherein the number of the second set of circuits is less than the number of the first set of circuits.

10. A storage device comprising:
at least one processing core;
a volatile memory;
a plurality of first memory channels each connected to a respective nonvolatile memory;
a bus connecting the at least one processing core, the volatile memory, and the first memory channels; and
a retention management module configured to refresh at least part of a first nonvolatile memory using the at least one processing core and the volatile memory,
wherein the retention management module is configured to, when no a first power is supplied from a host connected to the storage device, be periodically woken up, set the part of the first nonvolatile memory as a target refresh area, select a minimum resource combination of the storage device for refreshing the target refresh area, determine a second power and a clock frequency corresponding to the minimum resource combination to be lower than when the first power is supplied from the host, and refresh the target refresh area, and
wherein the minimum resource combination includes at least a part of the at least one processing core and includes the volatile memory.

11. The storage device of claim 10, further comprising:
a second memory channel connected to at least a second nonvolatile memory,
wherein the retention management module is configured to refresh the target refresh area using the second memory channel and the second nonvolatile memory.

12. The storage device of claim 11,
wherein the first nonvolatile memory is configured to be supplied with the first power supplied from the host, and
wherein, the second nonvolatile memory is configured such that the second nonvolatile memory is supplied with the second power lower than the first power when the first power is not supplied from the host.

13. The storage device of claim 12,
wherein the first nonvolatile memory is configured such that, when the first power is supplied to the first nonvolatile memory, the first nonvolatile memory receives a clock signal having a first frequency, and
wherein, the second nonvolatile memory is configured such that the second nonvolatile memory receives a clock signal having a second frequency lower than the first frequency when the first power is not supplied from the host.

14. The storage device of claim 11, further comprising:
a power module configured to supply the second power to the retention management module,
wherein the retention management module is configured such that, during performing a refresh operation, when the second power supplied from the power module becomes lower than a reference level, the retention management module stores refresh context regarding the refresh operation of the target refresh area, and
wherein the retention management module is configured such that, when the second power supplied from the power module becomes higher than the reference level during performing the refresh operation, the retention management module finishes the refresh operation of the target refresh area based on the refresh context.

15. A refresh method of a storage device including at least one nonvolatile memory, the refresh method comprising:
waking up a retention management module by receiving a second power from a power module of the storage device when a first power has been disconnected from a host;
selecting a target refresh area of the at least one nonvolatile memory;
determining a minimum resource combination of the storage device for refreshing the target refresh area;
selecting a power domain and a voltage of the second power to be supplied for the minimum resource combination;
selecting a clock domain and a clock frequency to be applied for the minimum resource combination;
performing a refresh operation of the target refresh area using the minimum resource combination; and
setting a next wake-up time.

16. The refresh method of claim 15, further comprising:
updating parameters including at least one of an erase count, program time, erase time, a read count, current temperature data, previous temperature data, and temperature variation data before the first power supplied from the host is disconnected;
creating a refresh area list using the parameters; and
setting a wake-up time for the retention management module.

17. The refresh method of claim 16, wherein the selecting the target refresh area, comprises:
determining whether there exists refresh context previously stored in a nonvolatile memory of the minimum resource combination, the refresh context including information regarding the refresh operation, and
when there exists refresh context previously stored, restoring the refresh context, and updating the refresh area list based on the restored refresh context.

18. The refresh method of claim 15, wherein performing the refresh operation of the target refresh area, comprises:

determining whether the second power supplied to the retention management module is less than a reference level, and storing, in a nonvolatile memory of the minimum resource combination, refresh context, the refresh context including data that needs to be refreshed in the target refresh area and/or system status log data.

19. The refresh method of claim 15, further comprising:

when the first power is supplied from the host, performing an operation for the at least one nonvolatile memory by using a first processing core of the storage device, wherein performing the refresh operation of the target refresh area uses a second processing core of the storage device.

20. The refresh method of claim 15, further comprising:

when the first power is supplied from the host, performing an operation for a first nonvolatile memory of the at least one nonvolatile memory, wherein performing the refresh operation of the target refresh area uses a second nonvolatile memory of the at least one nonvolatile memory.

* * * * *